(12) United States Patent
Huang et al.

(10) Patent No.: US 12,461,407 B2
(45) Date of Patent: Nov. 4, 2025

(54) ELECTRONIC DEVICE

(71) Applicant: InnoLux Corporation, Miao-Li County (TW)

(72) Inventors: Wen-Cheng Huang, Miao-Li County (TW); Bi-Ly Lin, Miao-Li County (TW); Chia-Chun Yang, Miao-Li County (TW); Ying-Jung Wu, Miao-Li County (TW); Chien-Wei Tseng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/753,191

(22) Filed: Jun. 25, 2024

(65) Prior Publication Data

US 2024/0345428 A1  Oct. 17, 2024

Related U.S. Application Data

(63) Continuation of application No. 18/384,647, filed on Oct. 27, 2023, now Pat. No. 12,044,914, which is a continuation of application No. 17/664,387, filed on May 20, 2022, now Pat. No. 11,835,805, which is a (Continued)

(30) Foreign Application Priority Data

Jun. 9, 2020 (CN) .......................... 202010516860.6

(51) Int. Cl.
    *G02F 1/1333* (2006.01)
(52) U.S. Cl.
    CPC .. *G02F 1/133305* (2013.01); *G02F 1/133308* (2013.01); *G02F 1/133345* (2013.01); *G02F 2202/28* (2013.01)

(58) Field of Classification Search
None
See application file for complete search history.

(56) References Cited

U.S. PATENT DOCUMENTS

| 2004/0095526 A1 | 5/2004 | Yamabuchi et al. |
| 2005/0162603 A1* | 7/2005 | Cheng ............... H01L 24/29 349/149 |
| 2011/0182046 A1 | 7/2011 | Shiota |

(Continued)

FOREIGN PATENT DOCUMENTS

| CN | 103022244 A | 4/2013 |
| TW | 201947869 A | 12/2019 |

*Primary Examiner* — Phu Vu
(74) *Attorney, Agent, or Firm* — MUNCY, GEISSLER, OLDS & LOWE, P.C.

(57) ABSTRACT

An electronic device including an active region and a peripheral region, and includes a substrate including a first edge; a first electrode layer disposed on the substrate; a first conductive glue disposed on the substrate and in the peripheral region; a second conductive glue disposed on the substrate and in the peripheral region; an insulating glue disposed in the peripheral region and overlapped with the first conductive glue and the second conductive glue; and a first metal element fixed on the first electrode layer through the first conductive glue and the insulating glue; wherein in a top view, the insulating glue extends along an extension direction parallel to the first edge, and along the extension direction, a sum of lengths of the first conductive glue and the second conductive glue is less than a length of the insulating glue.

8 Claims, 8 Drawing Sheets

Related U.S. Application Data continuation of application No. 17/318,225, filed on May 12, 2021, now Pat. No. 11,366,346.

(56) References Cited

U.S. PATENT DOCUMENTS

| | | |
|---|---|---|
| 2012/0161191 A1 | 6/2012 | Cheng et al. |
| 2014/0166451 A1* | 6/2014 | Lin ............... G06F 3/0443 200/266 |
| 2018/0101044 A1* | 4/2018 | Oka ............... G02F 1/1339 |
| 2021/0382341 A1 | 12/2021 | Huang et al. |
| 2022/0276524 A1 | 9/2022 | Huang et al. |
| 2024/0053627 A1 | 2/2024 | Huang et al. |

* cited by examiner

ELECTRONIC DEVICE

CROSS REFERENCE TO RELATED APPLICATION

This application claims the benefits of the Chinese Patent Application Serial Number 202010516860.6, filed on Jun. 9, 2020, the subject matter of which is incorporated herein by reference.

This application is a continuation (CA) of U.S. Patent application for "ELECTRONIC DEVICE", U.S. application Ser. No. 18/384,647 filed on Oct. 27, 2023; U.S. application Ser. No. 18/384,647 is a continuation (CA) of U.S. application Ser. No. 17/664,387 filed on May 20, 2022; U.S. application Ser. No. 17/664,387 is a continuation (CA) of U.S. application Ser. No. 17/318,225 filed on May 12, 2021, and the subject matter of which is incorporated herein by reference.

BACKGROUND

1. Field of the Disclosure

The present disclosure provides an electronic display device and, in particular an electronic device in which an upper substrate and a lower substrate are misaligned.

2. Description of Related Art

As the birth rate in the world continues to decline over the years, the labor force is gradually reduced, resulting in rising of labor costs, and thus various industries have begun to move toward the development of robots for replacing labors. With the continuous advancement of related technologies of electronic devices, industrial automation is regarded as an important future trend.

In prior electronic devices, conductive tape is often used as a medium for fixing and electrically connecting electronic components to each other. However, the use of conductive tape requires high precision in the manufacturing process, which is unfavorable to the development of automation. In addition, the metal components in the electronic device are prone to bend after being subject to hot and cold impact, causing deterioration of the electronic device.

Therefore, there is an urgent need to provide an electronic device and a manufacturing method thereof to improve the shortcomings of prior electronic devices.

SUMMARY

An object of the present disclosure is to provide an electronic device to improve the durability of the electronic device or to enhance the automation efficiency.

To achieve the object, the present disclosure provides an electronic device including an active region and a peripheral region adjacent to the active region, and which includes: a substrate comprising a first edge, wherein the peripheral region is located between the active region and the first edge of the substrate; a first electrode layer disposed on the substrate; a first conductive glue disposed on the substrate and in the peripheral region; a second conductive glue disposed on the substrate and in the peripheral region; an insulating glue disposed in the peripheral region and overlapped with the first conductive glue and the second conductive glue; and a first metal element fixed on the first electrode layer through the first conductive glue and the insulating glue; wherein in a top view, the insulating glue extends along an extension direction parallel to the first edge of the substrate, and along the extension direction, a sum of lengths of the first conductive glue and the second conductive glue is less than a length of the insulating glue.

Other novel features of the disclosure will become more apparent from the following detailed description when taken in conjunction with the accompanying drawings.

DETAILED DESCRIPTION OF EMBODIMENT

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

Ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. The ordinal numbers are only intended to distinguish a component with a name from another component with the same name.

In the present disclosure, the terms "almost", "about", "approximately" and "substantially" usually mean within 20%, 10% or 5%, or within 3%, 2% or 1%, or within 0.5% of a given value or range. The quantity given here is an approximate quantity. That is, without specifying "almost", "about", "approximately" and "substantially", it can still imply "almost", "about", "approximately" and "substantially".

In addition, the positions mentioned in the specification and claims, such as "over", "on" or "above", may mean that the two elements are in direct contact, or may mean that the two elements are not in direct contact.

The detailed structure of the electronic device of the present disclosure will be described in detail below, but the present disclosure is not limited to the following exemplary embodiments. The embodiments of the present disclosure can be combined with each other or other known structures to form another embodiment.

Figure 1:
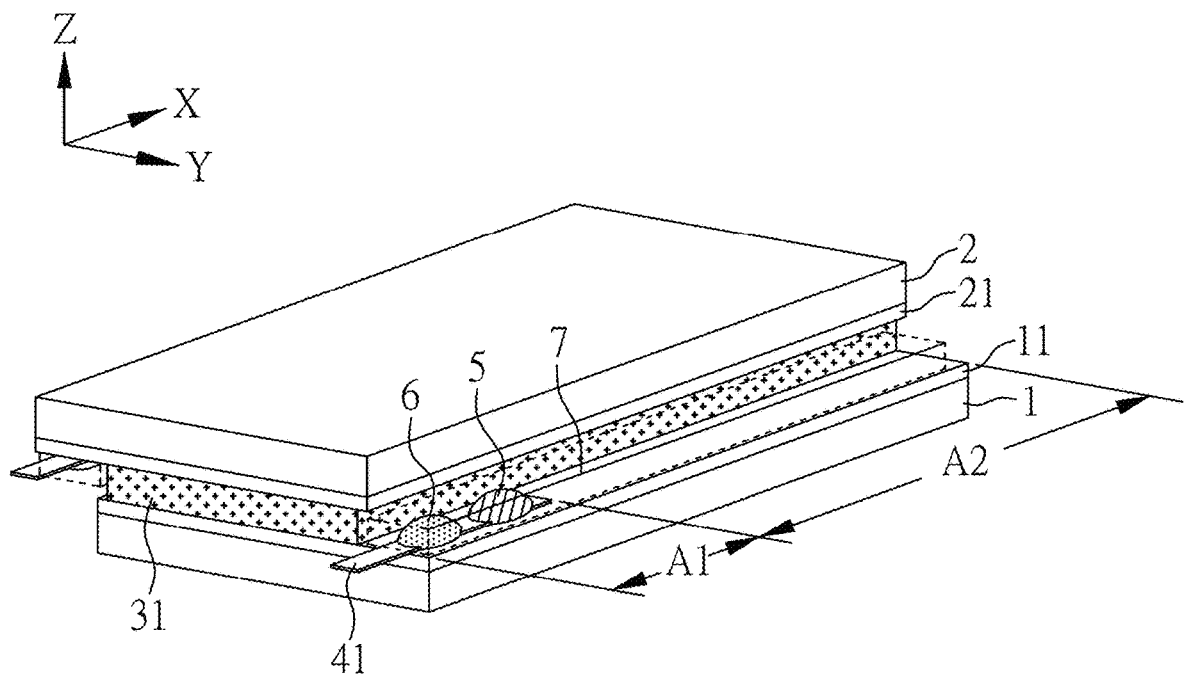
FIG. 1 is a perspective view of the electronic device in accordance with the present disclosure.

FIG. 1 is a perspective view of the electronic device according to an embodiment of the present disclosure. In FIG. 1, the X, Y and Z coordinates are shown, in which X direction is the first direction, Y direction is the second direction and Z direction is the third direction, which are different directions from each other. For example, the first direction X, the second direction Y, and the third direction Z are perpendicular to each other. As shown in FIG. 1, the electronic device of the present disclosure includes: a first substrate 1; a second substrate 2 disposed opposite to the first substrate 1; a first electrode layer 11 disposed on the first substrate 1; a second electrode layer 21 disposed on the second substrate 2; a display medium layer (not shown) disposed between the first electrode layer 11 and the second electrode layer 21; a sealant 31 disposed between the first electrode layer 11 and the second electrode layer 21 and configured to surround the display medium layer (not shown); and a first metal element 41 extending along the first direction X, wherein the first metal element 41 is fixed on the first electrode layer 11 through a conductive glue 5 and a first insulating glue 6. The conductive glue 5 and the first insulating glue 6 can be used to fix the first metal element 41 and, in addition, the electrical connection between the first metal element 41 and the first electrode layer 11 can be strengthened by the conductive glue 5. More specifically, the first substrate 1 includes a first area A1 and a second area A2. The first metal element 41 is disposed in the first area A1 and protrudes from the first substrate 1 along the first direction X. The conductive glue 5 and the first insulating glue 6 are disposed in the first area A1. Herein, the first area A1 refers to the area where the first substrate 1 does not overlap the second substrate 2 in the normal direction (i.e., the third direction Z) and does overlap the first metal element 41, and the second area A2 refers to the area where the first substrate 1 does not overlap the second substrate 2 in the normal direction (i.e., the third direction Z) and does not overlap the first metal element 41, that is, the area outside the first area A1. Therefore, in a top view direction, the conductive glue 5 and the first insulating glue 6 respectively overlap the first metal element 41 to fix the first metal element 41 onto the first electrode layer 11. Since the first metal element 41 is disposed in the first area A1 of the first substrate 1 but not in the second area A2, the first metal element 41 is not prone to bending after the hot and cold impact test, which can improve the durability of the electronic device.

Figure 2:
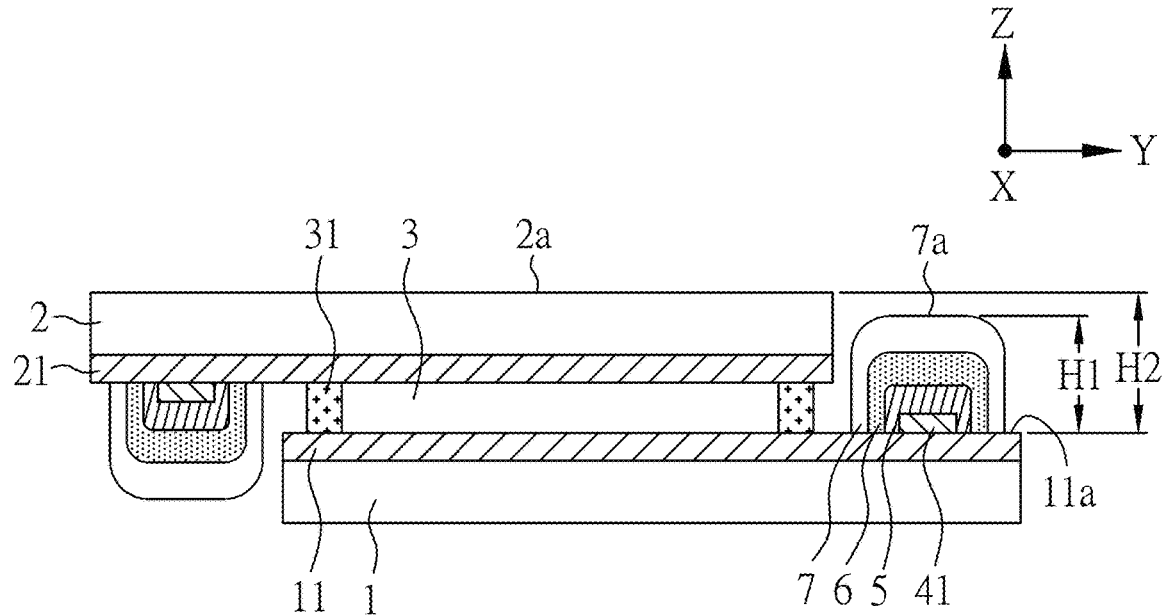
FIG. 2 is a side view of the electronic device in accordance with the present disclosure.

FIG. 2 is a side view of the electronic device according to an embodiment of the present disclosure. As shown in FIG. 2, the first substrate 1 protrudes from the second substrate 2 in the second direction Y, and the second substrate 2 protrudes from the first substrate 1 in a direction opposite to the second direction Y, wherein the second direction Y is approximately perpendicular to the first direction X. More specifically, the first substrate 1 protrudes from the second substrate 2 in the second direction Y, and the second substrate 2 protrudes from the first substrate 1 in a direction away from the second direction Y. In other words, the first substrate 1 and the second substrate 2 are arranged in a misaligned manner in the second direction Y. In addition, the sealant 31 is disposed between the first substrate 1 and the second substrate 2, and is disposed to surround the display medium layer 3.

With reference to FIG. 2, the electronic device of the present disclosure may further include a second insulating glue 7, which is disposed on the first substrate 1 and in the normal direction of the first substrate 1 (i.e., the third direction Z). The height H1 of the second insulating glue 7 is smaller than or equal to the height H2 from the top surface 2a of the second substrate 2 to the top surface 11a of the first electrode layer 11. More specifically, the height of the second insulating glue 7 refers to the height H1 from the top surface 7a of the second insulating glue 7 to the top surface 11a of the first electrode layer 11. As a result, it is advantageous in subsequent processing, for example, advantageous in subsequent bonding processing, so as to improve product reliability.

In the present disclosure, the first metal element 41 on the first substrate 1 can be electrically connected to the first electrode layer 11 through the conductive glue 5, so that an external circuit may apply voltage to the first electrode layer 11 through the first metal element 41 so as to control the display medium layer 3. Specifically, the external circuit may apply voltage to the first electrode layer 11 through the first metal element 41 to further control the tilt angle of liquid crystal so as to achieve the desired gray scale, but it is not limited to this. In addition, as shown in FIG. 2, the conductive glue 5 on the first substrate 1 does not contact the second electrode layer 21 so as to prevent the first electrode layer 11 and the second electrode layer 21 from electrical connection through the conductive glue 5 and causing a short circuit. Herein, as shown in FIG. 2, the first insulating glue 6 and the second insulating glue 7 on the first substrate 1 also do not contact the second electrode layer 21, but the present disclosure is not limited to this. In one embodiment of the present disclosure, part of the first insulating glue 6 and/or part of the second insulating glue 7 may contact the second electrode layer 21.

Herein, only the first metal element 41, the conductive glue 5, the first insulating glue 6 and the second insulating glue 7 on the first substrate 1 are taken as illustrative descriptions. It should be understood that the same or similar arrangement can be provided on the second substrate 2, so that an external circuit may apply voltage to the second electrode layer 21 through the first metal element 41.

With reference to FIG. 1 and FIG. 2, the manufacturing method of electronic device of the present disclosure may include the following steps: providing the first substrate 1 and the second substrate 2; disposing the first electrode layer 11 and the second electrode layer 11 on the first substrate 1 and the second substrate 2, respectively; providing the display medium layer 3, which is disposed between the first electrode layer 11 and the second electrode layer 21; providing the sealant 31, which is disposed between the first electrode layer 11 and the second electrode layer 21 and configured to surround the display medium layer 3; and providing the first metal element 41, wherein the first metal element 41 is fixed onto the first electrode layer 11 together with the first insulating glue 6 through a conductive glue 5. In addition, the aforementioned manufacturing method may further include: providing the second insulating glue 7, which is disposed on the first substrate 1, wherein, in a top view direction, the second insulating glue 7 at least partially overlaps the first electrode layer 11 and the first metal element 41, the conductive glue 5 may overlap at least part of the second insulating glue 7, and the first insulating glue 6 may also overlap at least part of the second insulating glue 7.

In the present disclosure, the manufacturing method of electronic device may, for example, firstly combine the first substrate 1 provided with the first electrode layer 11 and the second substrate 2 provided with the second electrode layer 21, and then use the conductive glue 5 and the first insulating glue 6 to fix the first metal element 41 onto the first electrode layer 11. Alternatively, it may firstly use the conductive glue 5 and the first insulating glue 6 to fix the first metal element 41 onto the first electrode layer 11, and then combine the first substrate 1 and the second substrate 2 to form the electronic device described in the present disclosure, but the present disclosure is not limited to this.

Figure 3A:
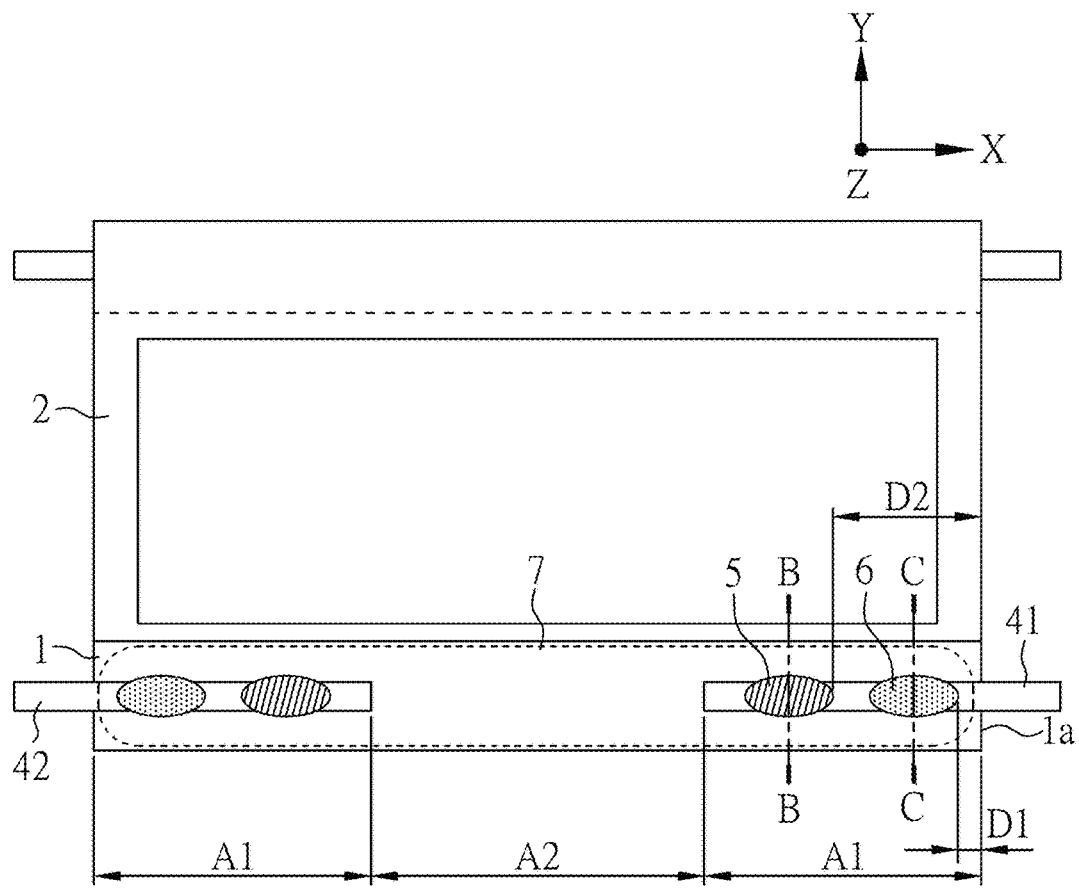
FIG. 3A is a top view of the electronic device according to a first embodiment of the present disclosure.
Figure 3B:
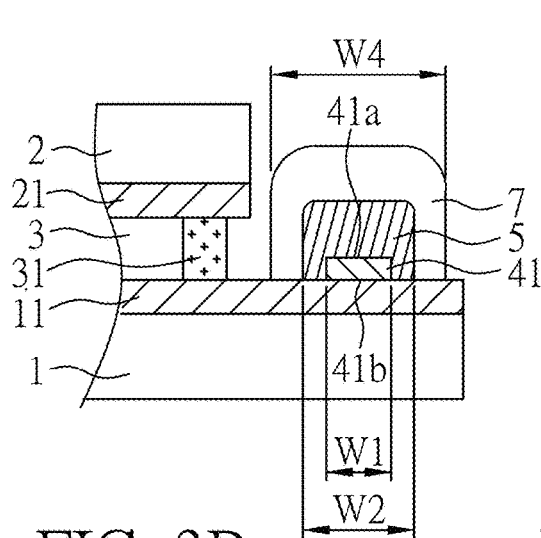
FIG. 3B is a cross-sectional view of the electronic device taking along the line B-B' of FIG. 3A.
Figure 3C:
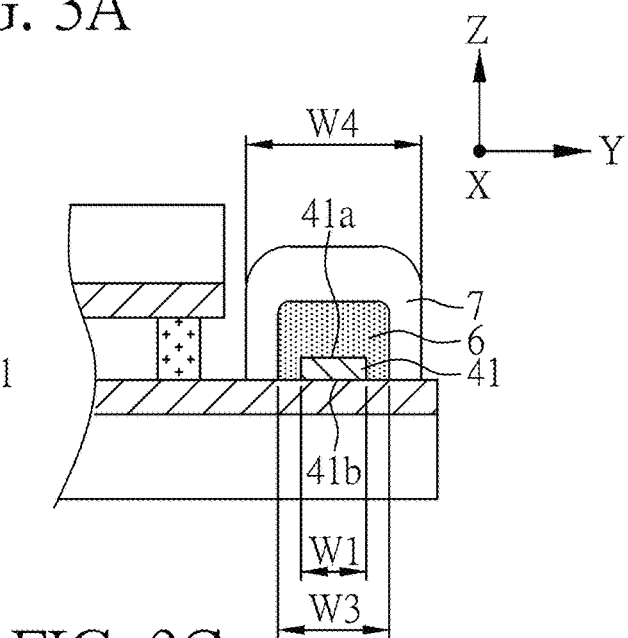
FIG. 3C is a cross-sectional view of the electronic device taking along the line C-C' of FIG. 3A.

FIG. 3A is a top view of the electronic device according to a first embodiment of the present disclosure. FIG. 3B and FIG. 3C are cross-sectional views of the electronic device taking along the line B-B' and the line C-C' of FIG. 3A, respectively.

As shown in FIGS. 3A to 3C, in the second direction Y, the width W2 of the conductive glue 5 and the width W3 of the first insulating glue 6 are each greater than the width W1 of the first metal element 41, so that the first metal element 41 is fixed on the first electrode layer 11. In this embodiment, the width W3 of the first insulating glue 6 is approximately equal to the width W2 of the conductive glue 5. However, the present disclosure is not limited to this. In other aspects of the embodiment, the width W3 of the first insulating glue 6 may be greater than the width W2 of the conductive glue 5, or the width W2 of the conductive glue 5 may be greater than the width W3 of the first insulating glue 6. In addition, in the second direction Y, the width W4 of the second insulating glue 7 is greater than each of the width W1 of the first metal element 41, the width W2 of the conductive glue 5, and the width W3 of the first insulating glue 6, so as to block oxygen and water thereby avoiding the deterioration of components due to moisture and oxygen. It is noted that, in the present disclosure, all the widths for measurement and comparison are those at the bottoms of the components in the cross-sectional view, but the present disclosure is not limited to this.

In the present disclosure, as shown in FIG. 3A, the first substrate 1 has a first edge 1a, wherein the extending direction of the first edge 1a is parallel to the second direction Y and, in the first direction X, the distance D1 from the first insulating glue 6 to the first edge 1a is smaller than the distance D2 from the conductive glue 5 to the first edge 1a. Such an arrangement facilitates fixing the first metal element 41 onto the first electrode layer 11, without causing poor electrical properties due to cracking by external force. In other words, the first insulating glue 6 is disposed closer to the first edge 1a than the conductive glue 5 is. In this embodiment, the first edge 1a and the first direction X are perpendicular to each other, but the present disclosure is not limited to this. In other embodiments of the present disclosure, the first edge 1a may not be a straight edge, but may be a curved edge, as long as the first insulating glue 6 is disposed closer to the first edge 1a than the conductive glue 5 is.

With reference to FIG. 3A again, the electronic device may further include a second metal element 42 disposed on the first electrode layer 11 and configured to extend along the first direction X, and the second metal element 42 protrudes from the first substrate 1 along the first direction X. More specifically, the first substrate 1 has two first areas A1 and one second area A2. The first metal element 41 and the second metal element 42 are respectively disposed in the two first areas A1, wherein the second metal element 42 extends in a direction away from the first metal element 41, and the second metal element 42 protrudes from the first substrate 1 in a direction away from the first metal element 41.

As shown in FIGS. 3A to 3C, in this embodiment, the manufacturing method of electronic device includes: providing the first metal element 41 on the first electrode layer 11; then, coating the conductive glue 5 and a first insulating glue 6 on the first metal element 41, wherein the conductive glue 5 and the first insulating glue 6 are not overlapped in the top view direction so that the conductive glue 5 and the first insulating glue 6 can be coated approximately at the same time to shorten the processing time; afterwards, coating the second insulating glue 7 on the first electrode layer 11, wherein, in the top view direction, the second insulating glue 7 at least partially overlaps each of the first electrode layer 11 and the first metal element 41, and the conductive glue 5 may overlap at least part of the second insulating glue 7 and the first insulating glue 6 may also overlap at least part of the second insulating glue 7.

Therefore, as shown in FIG. 3B and FIG. 3C, in the normal direction of the first substrate 1 (i.e., the third direction Z), the conductive glue 5 and the first insulating glue 6 are located on the same side of the first metal element 41. More specifically, the first metal element 41 has an upper surface 41a and a lower surface 41b opposite to the upper surface 41a, wherein the lower surface 41b is adjacent to the first electrode layer 11, and the conductive glue 5 and the first insulating glue 6 are provided on the upper surface 41a and adjacent to the first metal element 41.

In the present disclosure, the materials of the first substrate 1 and the second substrate 2 are not particularly limited and, in this embodiment, the first substrate 1 and the second substrate 2 may be, for example, a flexible substrate, a rigid substrate, or a combination thereof. For example, the material of the substrate 110 may include glass, quartz, sapphire, ceramics, polycarbonate (PC), polyimide (PI), polyethylene terephthalate (PET), other suitable substrate materials, or a combination thereof, but it is not limited thereto. The materials of the first electrode layer 11 and the second electrode layer 21 are not particularly limited, and the first electrode layer 11 and the second electrode layer 21 may be made of the same or different materials, which may be, for example, indium tin oxide (ITO), indium zinc oxide (IZO), indium tin zinc oxide (ITZO), indium gallium zinc oxide (IGZO), or a combination thereof, but the present disclosure is not limited thereto. The materials of the first metal element 41 and the second metal element 42 are not particularly limited, and the first metal element 41 and the second metal element 41 may be made of the same or different materials, which may be, for example, gold, silver, copper, aluminum, titanium, chromium, nickel, molybdenum, tin, alloys thereof, or a combination thereof, but the present disclosure is not limited thereto.

Herein, the conductive adhesive 5 is a material with good conductive function, and has the characteristic of low volume resistance after curing. For example, it may include silver adhesive, but the present disclosure is not limited to this. The material of the first insulating glue 6 may include acrylic, rubber, resin or a combination thereof. For example, insulating glue with a shear strength (standard test method for shear strength: ASTM D 3080) of 21 Mpa may be selected, which facilitates increase of the adhesion strength of the component thereby avoiding damage caused by external force. The material of the second insulating glue 7 may include resin, high polymer, or a combination thereof. For example, an insulating glue with a moisture absorption rate of 0.3% after being placed under a relative humidity of 90% for 24 hours may be selected, which facilitates blocking of water and oxygen, but the present disclosure is not limited to this.

Figure 4A:
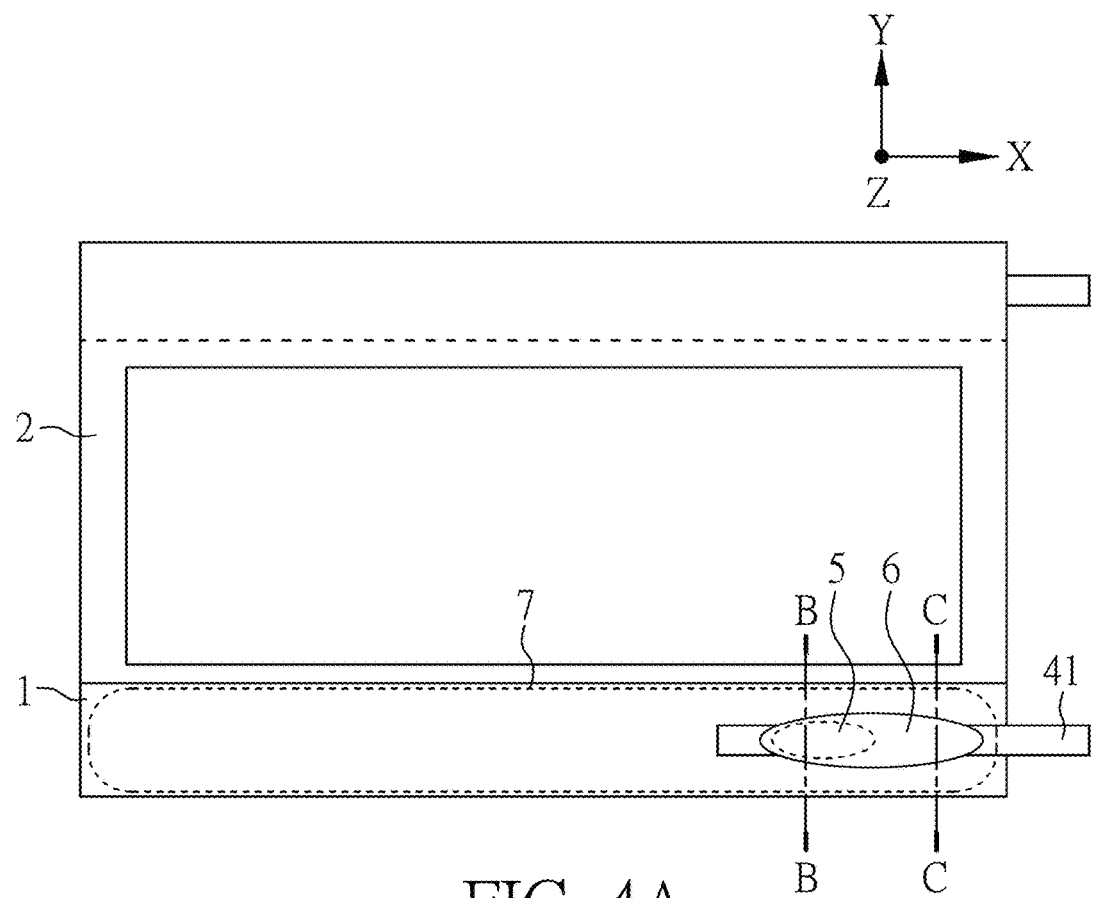
FIG. 4A is a top view of the electronic device according to a second embodiment of the present disclosure.
Figures 4B, 4C:
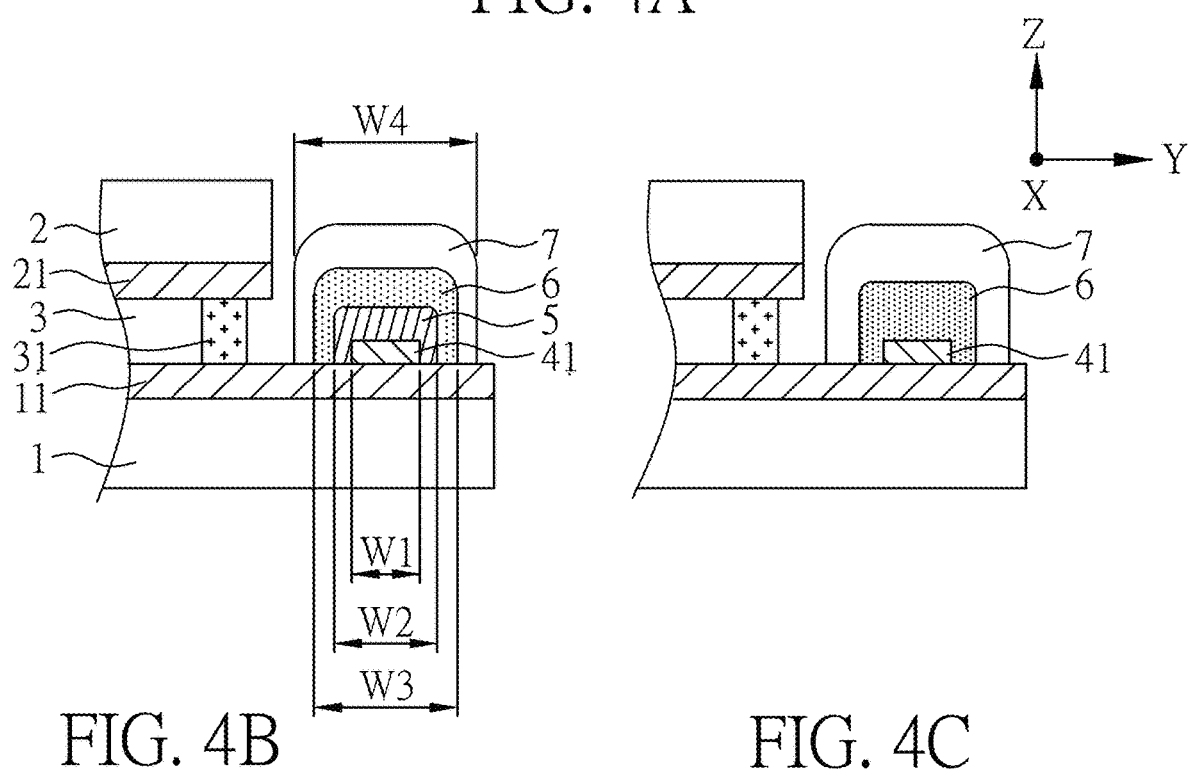
FIG. 4B is a cross-sectional view of the electronic device taking along the line B-B' of FIG. 4A.
FIG. 4C is a cross-sectional view of the electronic device taking along the line C-C' of FIG. 4A.

FIG. 4A is a top view of the electronic device according to a second embodiment of the present disclosure. FIG. 4B and FIG. 4C are cross-sectional views of the electronic device taking along the line B-B' and the line C-C' of FIG. 4A, respectively. The electronic device of this embodiment is similar to that of the first embodiment, except for the following differences. In this embodiment, the second metal element 42 is omitted in FIG. 4A, but this embodiment is not limited to this. In other aspects of this embodiment, the second metal element 42 may also be included, and its arrangement is similar to that of the first metal element 41 and thus will not be described again.

As shown in FIGS. 4A to 4C, in the top view direction, the conductive glue 5 may overlap at least part of the first insulating glue 6, wherein, in the second direction Y, the width W3 of the first insulating glue 6 is greater than the width W2 of the conductive glue 5, and the width W2 of the conductive glue 5 is greater than the width W1 of the first metal element 41. More specifically, in the top view direction, the conductive glue 5 overlaps at least part of the first insulating glue 6, so that the bonding between the conductive glue 5 and the first metal element 4 can be strengthened to improve the reliability of the electronic device, but it is not limited to this.

The manufacturing method of this embodiment is similar to the first embodiment, except for the following differences.

As shown in FIG. 4A to FIG. 4C, the manufacturing method of the electronic device of this embodiment includes: providing the first metal element 41 on the first electrode layer 11; then, coating the conductive glue on the first metal element 41; afterwards, coating the first insulating glue 6 on the conductive glue 5 and the first metal element 41, wherein the first insulating glue 6 may completely cover the conductive glue 5, so as to strengthen the bonding of the conductive glue 5 and the first metal element 41; and coating the second insulating glue 7 on the first electrode layer 11, the first metal element 4, the conductive glue 5 and the first insulating layer 6, but the manufacturing method of electronic device of the present disclosure is not limited to this.

Therefore, as shown in FIG. 4A, in the top view direction, the conductive glue 5 may overlap at least part of the first insulating glue 6. More specifically, as shown in FIG. 4B, in the normal direction of the first substrate 1 (i.e. in the third direction Z), the conductive glue 5 is disposed between the first metal element 41 and the first insulating glue 6, and the first insulating glue 6 is disposed between the conductive glue 5 and the second insulating glue 7. In addition, the conductive glue 5 and the first insulating glue 6 are located on the same side of the first metal element 41.

Figure 5A:
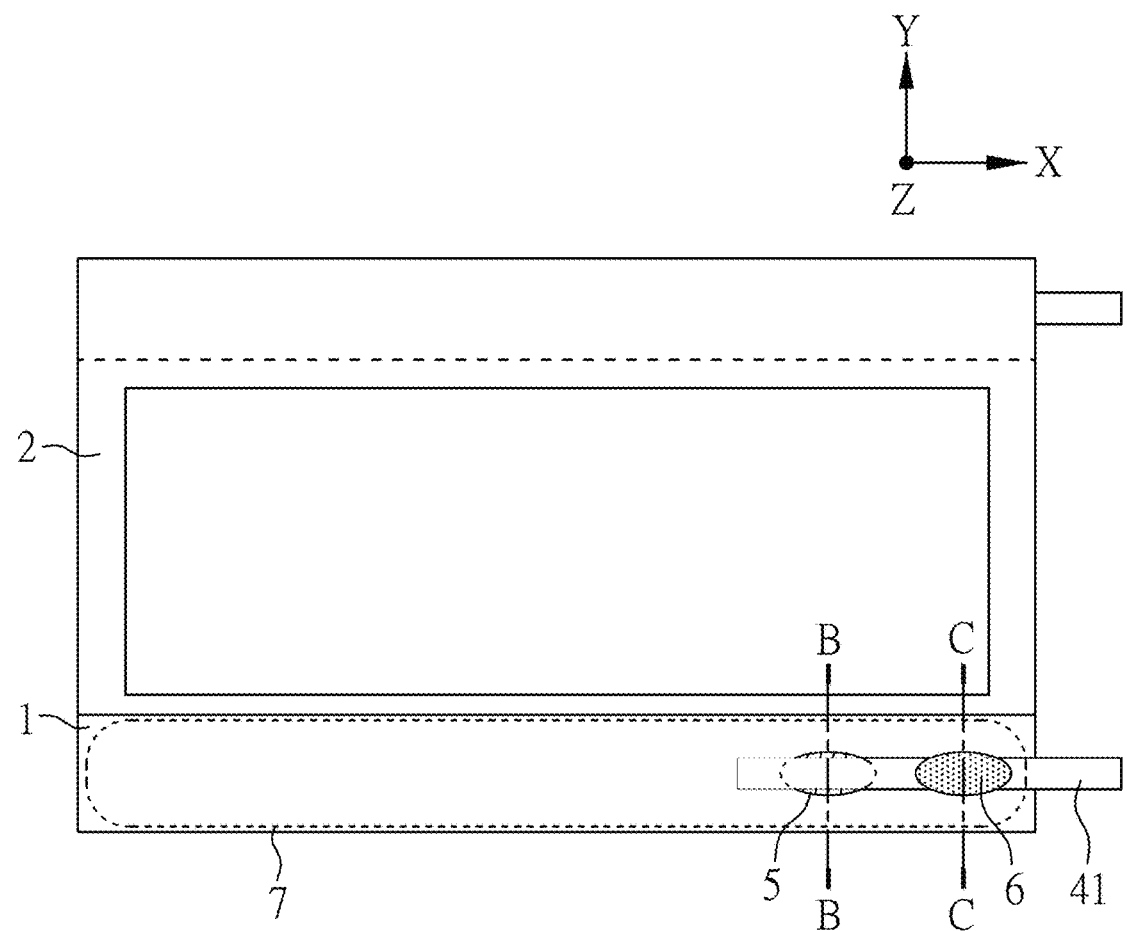
FIG. 5A is a top view of the electronic device according to a third embodiment of the present disclosure.
Figure 5B:
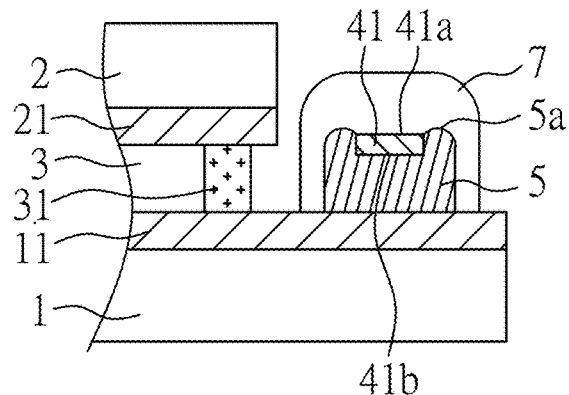
FIG. 5B is a cross-sectional view of the electronic device taking along the line B-B' of FIG. 5A.
Figure 5C:
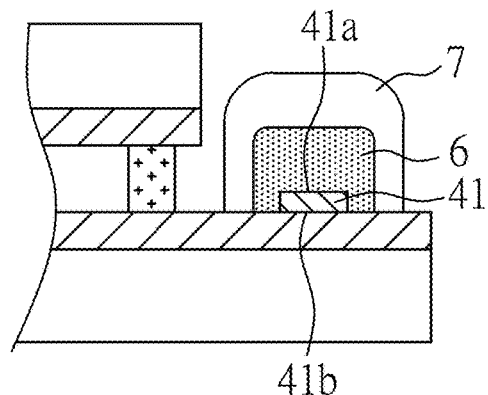
FIG. 5C is a cross-sectional view of the electronic device taking along the line C-C' of FIG. 5A.

FIG. 5A is a top view of the electronic device according to a third embodiment of the present disclosure. FIG. 5B and FIG. 5C are cross-sectional views of the electronic device taking along the line B-B' and the line C-C' of FIG. 5A, respectively. The electronic device and the manufacturing method of this embodiment are similar to those of the first embodiment, except for the following differences. In this embodiment, the second metal element 42 is omitted in FIG. 5A, but this embodiment is not limited to this. In other aspects of this embodiment, the second metal element 42 may also be included, and its arrangement is similar to that of the first metal element 41 and thus will not be described again.

As shown in FIG. 5A to FIG. 5C, in this embodiment, the conductive glue 5 is first coated on the first electrode layer 11; then, the first metal element 41 is provided on the conductive glue 5 and the first electrode layer 11; afterwards, the first insulating glue 6 is coated on the first metal element 41; and subsequently, the second insulating glue 7 is coated on the first electrode layer 11, the first metal element 41, the conductive glue 5 and the first insulating layer 6.

In this embodiment, because the first metal element 41 is provided on the first electrode layer 11 and the conductive glue 5 when the conductive glue 5 is not completely cured, the first metal element 41 will be slightly trapped in the conductive glue 5, as shown in FIG. 5B, More specifically, in the normal direction of the first substrate 1 (i.e., the third direction Z), the first metal element 41 is disposed between the conductive glue 5 and the second insulating glue 7, and the conductive glue 5 has a protruding surface 5a that does not overlap the first metal element 41.

In addition, in this embodiment, the conductive glue 5 and the first insulating glue 6 are located on different sides of the first metal element 41. More specifically, the conductive glue 5 is disposed adjacent to the lower surface 41b of the first metal element 41, and the first insulating glue 6 is disposed adjacent to the upper surface 41a of the first metal element 41. However, this embodiment is not limited to this. In other aspects of this embodiment, the first insulating glue 6 is firstly coated on the first electrode layer 11; then, the first metal element 41 is provided on the first insulating glue 6 and the first electrode layer 11; afterwards, the conductive glue 5 is coated on the first metal element 41; and subsequently, the second insulating glue 7 is coated on the first electrode layer 11, the first metal element 4, the conductive glue 5 and the first insulating glue 6. Therefore, the conductive glue 5 is disposed adjacent to the upper surface 41a of the first metal element 41, and the first insulating glue 6 is disposed adjacent to the lower surface 41b of the first metal element 41.

Figure 6A:
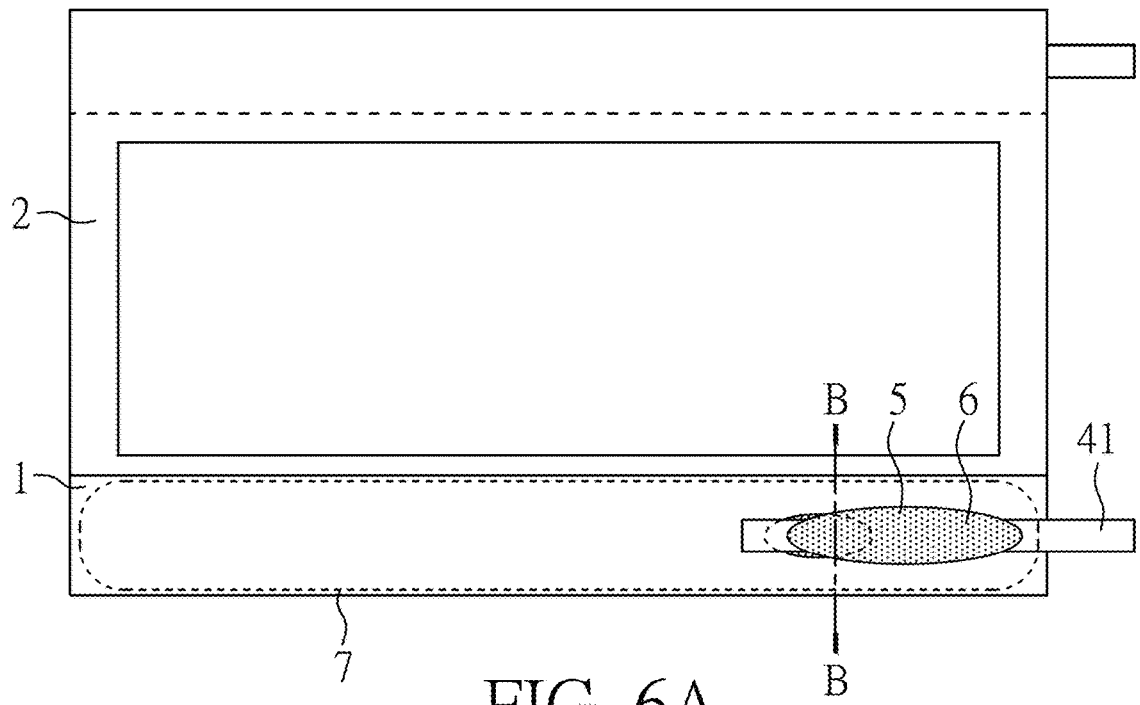
FIG. 6A is a top view of the electronic device according to a fourth embodiment of the present disclosure.
Figure 6B:
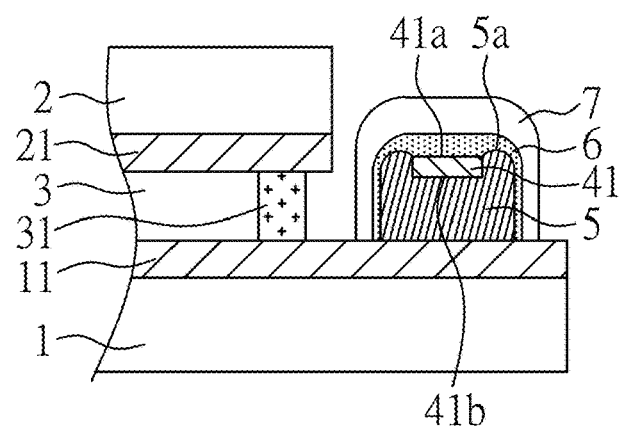
FIG. 6B is a cross-sectional view of the electronic device taking along the line B-B' of FIG. 6A.

FIG. 6A is a top view of the electronic device according to a fourth embodiment of the present disclosure. FIG. 6B is a cross-sectional view of the electronic device taking along the line B-B' of FIG. 6A. In this embodiment, the electronic device is similar to that of the second embodiment, except for the following differences.

As shown in FIG. 6A and FIG. 6B, in this embodiment, the conductive glue 5 is firstly coated on the first electrode layer 11; then, the first metal element 41 is provided on the first electrode layer 11 and the conductive glue 5; afterwards, the first insulating glue 6 is coated on the first metal element 41 and the conductive glue 5; and subsequently, the second insulating glue 7 is coated on the first electrode layer 11, the first metal element 41, the conductive glue 5 and the first insulating glue 6.

In this example, because the first metal element 41 is provided on the first electrode layer 11 and the conductive glue 5 when the conductive glue is not completely cured, the first metal element 41 will be slightly trapped in the conductive glue 5, as shown in FIG. 6B. Specifically, the conductive glue 5 has a protruding surface 5a, and the protruding surface 5a does not overlap the first metal element 41. In addition, in the top view direction, the conductive glue 5 may overlap at least part of the first insulating glue 6. More specifically, in the normal direction of the first substrate 1 (i.e., the third direction Z), the first metal element 41 is disposed between the conductive glue 5 and the first insulating glue 6, so that the bonding between the conductive glue 5 and the first metal element 41 can be strengthened. In this embodiment, in the top view direction, the conductive glue 5 and the first insulating glue 6 are not completely overlapped. More specifically, as shown in FIG. 6A, in the top view direction, part of the conductive glue 5 and the first insulating glue 6 are not overlapped, but the present disclosure is not limited to this. In other aspects of this embodiment, the conductive glue 5 and the first insulating glue 6 are completely overlapped, so as to have a better bonding effect between the conductive glue 5 and the first metal element 41.

With reference to FIG. 6B again, in this embodiment, the conductive glue 5 and the first insulating glue 6 are located on different sides of the first metal element 41. More specifically, the conductive glue 5 is disposed adjacent to the bottom surface 41b of the first metal element 41, and the first insulating glue 6 is disposed adjacent to the upper surface 41a of the first metal element 41.

Figure 7A:
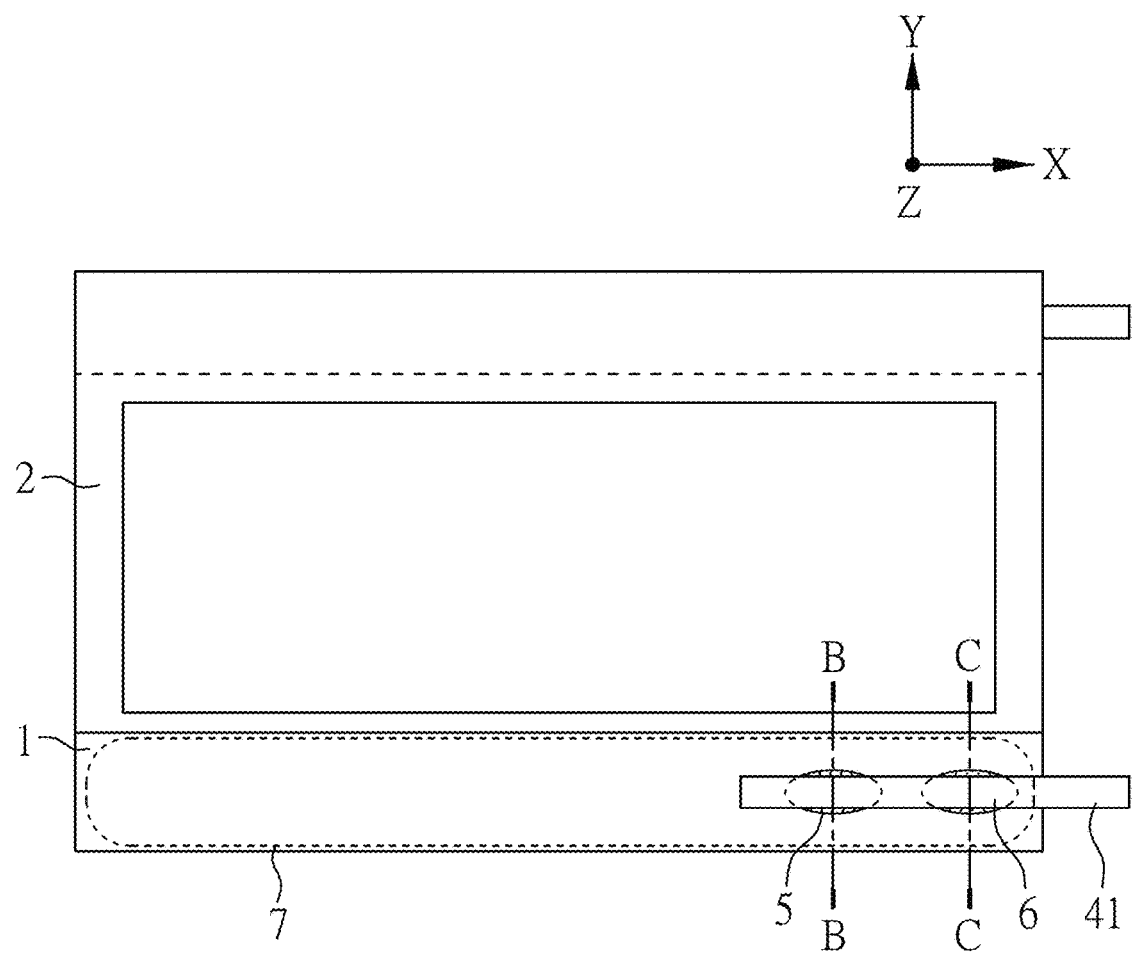
FIG. 7A is a top view of the electronic device according to a fifth embodiment of the present disclosure.
Figure 7B:
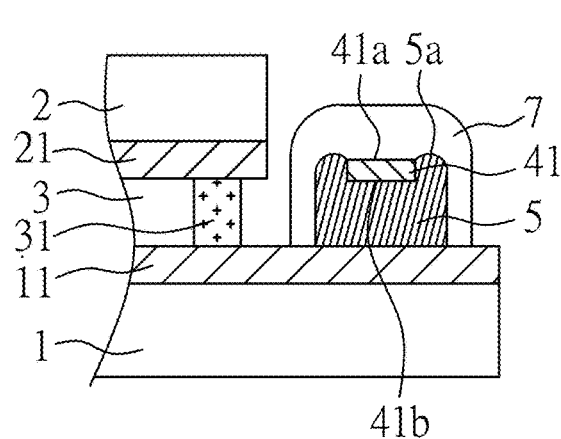
FIG. 7B is a cross-sectional view of the electronic device taking along the line B-B' of FIG. 7A.
Figure 7C:
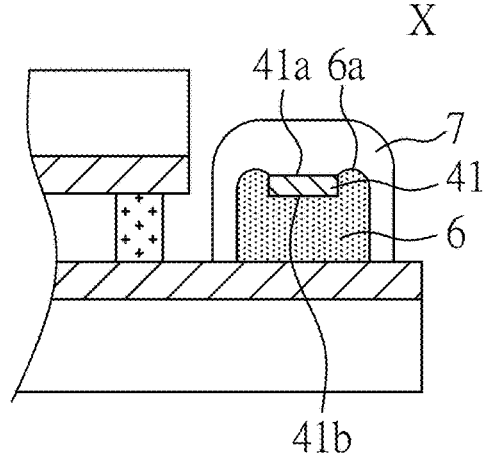
FIG. 7C is a cross-sectional view of the electronic device taking along the line C-C' of FIG. 7A.

FIG. 7A is a top view of the electronic device according to a fifth embodiment of the present disclosure. FIG. 7B and FIG. 7C are cross-sectional views of the electronic device taking along the line B-B' and the line C-C' of FIG. 7A, respectively. The electronic device of this embodiment is similar to that of the first embodiment, except for the following differences. In this embodiment, the second metal element 42 is omitted in FIG. 7A, but this embodiment is not limited to this. In other aspects of this embodiment, the second metal element 42 may also be included, and its arrangement is similar to that of the first metal element 41 is similar and thus will not be described again.

As shown in FIG. 7A to FIG. 7C, in this embodiment, the conductive glue 5 and the first insulating glue 6 are firstly coated on the first electrode layer 11; then, the first metal element 41 is provided on the first electrode Layer 11, the conductive glue 5 and the first insulating glue 6; and afterwards, the second insulating glue 7 is coated on the first electrode layer 11, the first metal element 41, the conductive glue 5 and the first insulating layer 6. Therefore, the conductive glue 5 and the first insulating glue 6 are located on the same side of the first metal element 41. More specifically, as shown in FIG. 7B and FIG. 7C, the conductive glue 5 and the first insulating glue 6 are disposed respectively adjacent to the lower surface 41b of the first metal element 41.

In addition, in this embodiment, because the first metal element 41 is provided on the first electrode layer 11, the conductive glue 5 and the first insulating glue 6 when the conductive glue 5 and the first insulating glue 6 are not completely cured, the first metal element 41 will be slightly trapped in the conductive glue 5 and the first insulating glue 6, as shown in FIG. 7B and FIG. 7C. More specifically, in the normal direction of the first substrate 1 (i.e., the third direction Z), the first metal element 41 is disposed between the conductive glue 5 and the second insulating glue 7, and the first metal element 41 is also disposed between the first insulating glue 6 and the second insulating glue 7. In addition, the conductive glue 5 and the first insulating glue 6 have a protruding surface 5a and a protruding surface 6a, respectively, and each of the protruding surface 5a and the protruding surface 6a does not overlap the first metal element 41.

Figure 8:
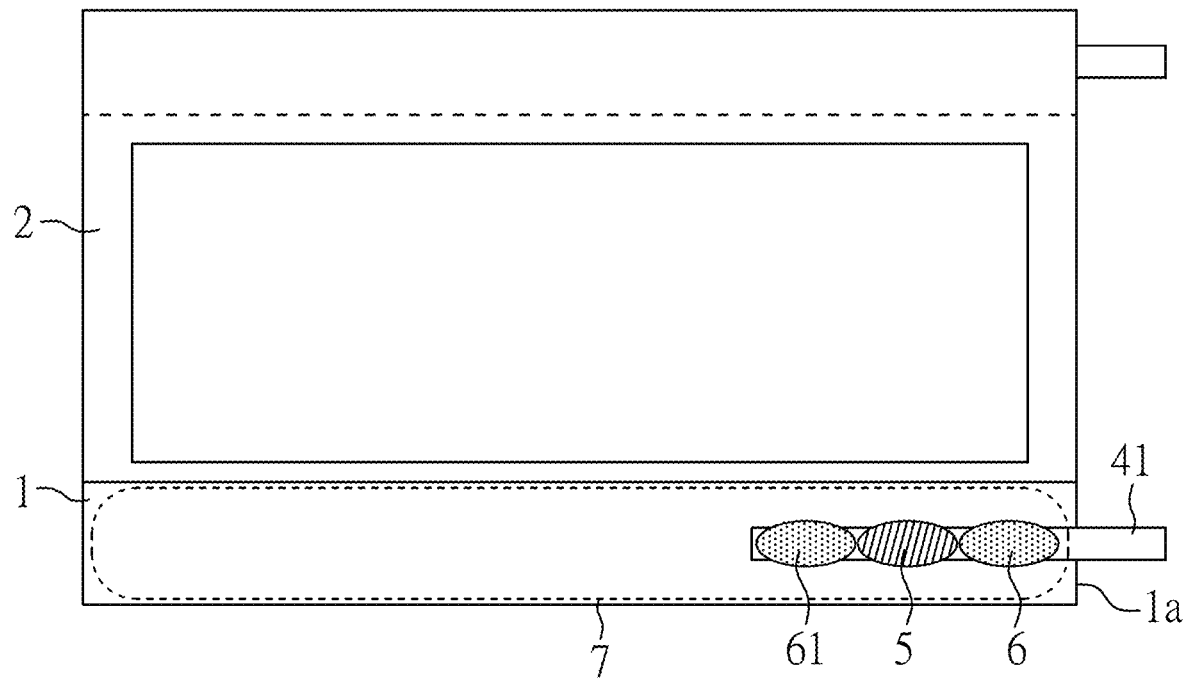
FIG. 8 is a top view of the electronic device according to a sixth embodiment of the present disclosure.

FIG. 8 is a top view of the electronic device according to a sixth embodiment of the present disclosure. The electronic device of this embodiment is similar to that of the first embodiment, except for the following differences. In this embodiment, the second metal element 42 is omitted in FIG. 8, but this embodiment is not limited to this. In other aspects of the this embodiment, the second metal element 42 may also be included, and its arrangement is similar to that of the first metal element 41 and thus will not be described again.

As shown in FIG. 8, the electronic device of this embodiment further includes a third insulating glue 61 disposed on the first electrode layer 11, wherein, in the first direction X, the conductive glue 5 is disposed between the first insulating glue 6 and the third insulating glue 61, and the first insulating glue 6 is disposed adjacent to the first edge 1a of the first substrate 1. In this embodiment, in the top view direction, the conductive glue 5 does not overlap the first insulating glue 6 and the third insulating glue 61, but the present disclosure is not limited to this. In other aspects of this embodiment, the conductive glue 5 may partially overlap the first insulating glue 6 and/or the third insulating glue 61, so as to improve the reliability of the electronic device.

In this embodiment, the order in which the first metal element 41, the conductive glue 5, the first insulating glue 6 and the third insulating glue 61 are disposed is not particularly limited. For example, the first metal element 41 may be firstly provided on the electrode layer 11, and then the conductive glue 4, the first insulating glue 6 and the third insulating glue 61 are coated on the first metal element 41; alternatively, arrangement similar to that of the third embodiment or fifth embodiment may be adopted and a detailed description therefor is deemed unnecessary.

In this embodiment, the material of the third insulating glue 61 is similar to that of the first insulating glue 6 and thus a description therefor is deemed unnecessary, and the materials of the first insulating glue 6 and the third insulating glue 61 may be the same or different from each other. When the materials of the first insulating glue 6 and the third insulating glue 61 are the same, the first insulating glue 6 and the third insulating glue 61 are applied approximately at the same time, so as to shorten the processing time.

Figure 9:
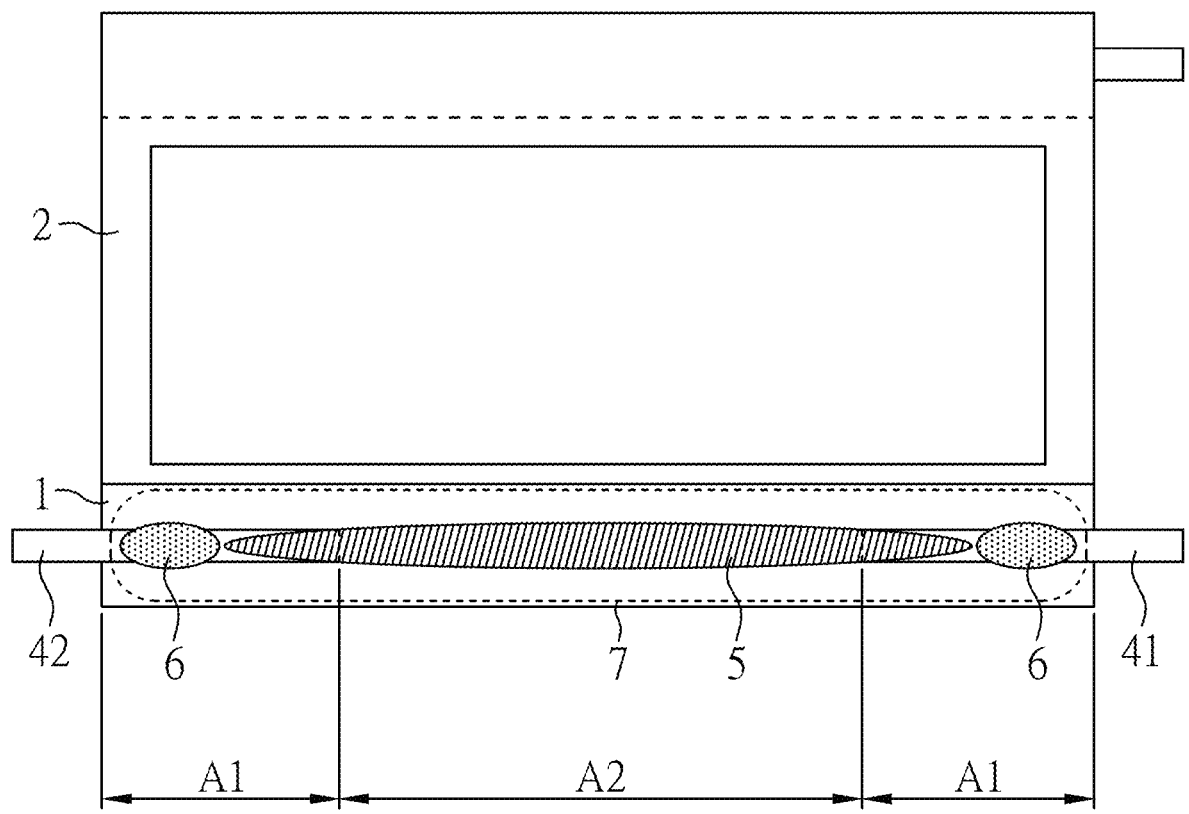
FIG. 9 is a top view of the electronic device according to a seventh embodiment of the present disclosure.

FIG. 9 is a top view of the electronic device according to a seventh embodiment of the present disclosure. The electronic device of this embodiment is similar to that of the first embodiment, except for the following differences.

As shown in FIG. 9, the conductive glue 5 of the electronic device of this embodiment extends along the first direction X, and the conductive glue 5 partially overlaps the first metal element 41 and the second metal element 42, respectively. More specifically, in the top view direction, the conductive glue 5 extends along a direction away from the first metal element 41 (i.e., away from the first direction X) for being disposed in the first areas A1 and the second area A2, which can strengthen the electrical connection between the first metal element 41 and the first electrode layer 11.

In this embodiment, in the top view direction, the conductive glue 5 and the first insulating glue 6 are not overlapped, but the present disclosure is not limited to this. In other aspects of this embodiment, the conductive glue 5 may overlap at least part of the first insulating glue 6 to strengthen the bonding between the conductive glue 5 and the first metal element 41. In addition, the manufacturing method may be similar to that of the first embodiment to fifth embodiment, and thus will not be described again. In this embodiment, the conductive glue 5 extends along the first direction X and partially overlaps the first metal element 41 and the second metal element 42, respectively. More specifically, the coating of the conductive glue 5 from the first metal element 41 to the second metal element 41 may be linear coating, wave-like coating, non-continuous line or other non-linear coating methods, or a combination thereof, but the present disclosure is not limited to this.

The electronic device of this embodiment includes a first metal element 41 and a second metal element 42, but the present disclosure is not limited to this. In other aspects of this embodiment, the second metal element 42 may also be omitted and thus only the first metal element 41 is connected to an external circuit.

In summary, in the present disclosure, the first metal element 41 is fixed on the first electrode layer 11 with the conductive glue 5 and the first insulating glue 6, so that the first metal element 41 and the first electrode layer 11 can be electrically connected. In addition, since the first metal element 41 is disposed in the first area A1 of the first substrate 1 but not in the second area A2, the first metal element 41 can be prevented from bending after being subject to cold and hot impact, thereby improving the durability of the electronic device.

In this disclosure, the electronic device manufactured in the aforementioned embodiments may be a display device, for example, a liquid crystal display device, including vertical alignment (VA), in-plane switching (IPS) and fringe field switching (FFS) liquid crystal display devices, but the present disclosure is not limited to this. In addition, the electronic device of the present disclosure may be used on display devices known in the art, such as displays, music players, mobile navigation devices, etc., but the present disclosure is not limited thereto.

The aforementioned specific embodiments should be construed as merely illustrative, and not limiting the rest of the present disclosure in any way.

What is claimed is:

1. An electronic device including an active region and a peripheral region adjacent to the active region, and comprising:
    a substrate having a first edge, a second edge and a third edge, wherein the first edge extends along a first direction, the second edge and the third edge extend along a second direction perpendicular to the first direction, the first edge is connected between the second edge and the third edge, and the peripheral region is located between the active region and the first edge of the substrate;
    a first electrode layer disposed on the substrate;
    a first conductive glue disposed on the substrate and in the peripheral region;
    a second conductive glue disposed on the substrate and in the peripheral region;
    an insulating glue disposed in the peripheral region and overlapped with the first conductive glue and the second conductive glue;
    a first element comprising a first metal material and having a first long edge, wherein the first long edge extends along the first direction, and the first element is fixed on the first electrode layer through the first conductive glue and the insulating glue; and
    a second element comprising a second metal material and having a second long edge, wherein the second long edge extends along the first direction, and the second element is fixed on the first electrode layer through the second conductive glue and the insulating glue;
    wherein in a top view, the insulating glue extends along the first direction, and along the first direction, a sum of a length of the first conductive glue and a length of the second conductive glue is less than a length of the insulating glue,
    wherein the first element comprises a first part and a second part, the second element comprises a third part and a fourth part, the first part and the third part overlap the substrate, and the second part and the fourth part do not overlap the substrate,
    wherein along the first direction, a first minimum distance between the insulating glue and the second edge is different from a second minimum distance between the insulating glue and the third edge.

2. The electronic device of claim 1, wherein each of the length of the first conductive glue and the length of the second conductive glue is less than a half of the length of the insulating glue.

3. The electronic device of claim 1, further comprising another substrate disposed opposite to the substrate, wherein an edge portion of the substrate is not overlapped with the another substrate.

4. The electronic device of claim 3, further comprising a second electrode layer disposed on the another substrate.

5. The electronic device of claim 1, further comprising a display medium disposed on the first electrode layer.

6. The electronic device of claim 1, wherein the first element is disposed between the first conductive glue and the insulating glue in a normal direction of the substrate.

7. The electronic device of claim 6, wherein the first conductive glue is disposed between the first element and the substrate in the normal direction of the substrate.

8. The electronic device of claim 1, wherein a shortest distance between the second edge and the first conductive glue is greater than a shortest distance between the second edge and the second conductive glue.

* * * * *